United States Patent [19]

Marler, Jr. et al.

[11] 4,064,356

[45] Dec. 20, 1977

[54] SOLDERED JOINT

[75] Inventors: Norman O. Marler, Jr., Londonderry; Benjamin M. Mikulis, Jr., Nashua, both of N.H.

[73] Assignee: Sander Associates, Inc., South Nashua, N.H.

[21] Appl. No.: 666,096

[22] Filed: Mar. 11, 1976

[51] Int. Cl.² .............................................. H05K 1/00
[52] U.S. Cl. ................................ 174/68.5; 174/94 R; 361/408
[58] Field of Search ............................ 174/68.5, 94 R; 361/397, 398, 400, 401, 403, 404, 405, 406, 408, 411; 338/327, 328, 329

[56] References Cited

U.S. PATENT DOCUMENTS

| 3,612,745 | 10/1971 | Warren | 174/68.5 |
| 3,643,006 | 2/1972 | Ance | 174/94 R X |
| 3,825,801 | 7/1974 | Beavitt | 361/403 |
| 3,855,693 | 12/1974 | Umbaugh | 361/408 X |

Primary Examiner—Arthur T. Grimley
Attorney, Agent, or Firm—Louis Etlinger; Robert K. Tendler

[57] ABSTRACT

A soldered joint between a thin flat conductive lead and a flat conductive pad in which the lead is "rippled," that is, formed with undulations each of which engages the surface of the pad so that during soldering, the molten solder fills the spaces between the pad and the lead and then solidifies forming the soldered joint.

8 Claims, 2 Drawing Figures

SOLDERED JOINT

Government Rights

The invention herein described was made in the course of or under a contract with the Department of the Navy.

FIELD OF THE INVENTION

This invention relates generally to soldered connections and methods of making them and particularly to such connections which join thin flat conductive leads to conductive pads.

BACKGROUND

The manufacturers of electrical equipment face a problem of making reliable connections between a thin flat conductive lead and conductive terminals or pads. The leads may, for example, be the conductors of a flexible printed circuit and/or may be the leads from flat pack integrated circuits, both of which may be required to be connected to flat pads on printed wiring boards. In the past, many arrangements have been used but perhaps the most frequently used arrangement has been to pre-coat both the lead and the pad with solder, place the flat lead against the pad and solder the joint. However, it has been found that such connections are subject to large proportion of failures, usually by the tendency of the leads to lift from the pad after soldering.

In the case of flexible circuits, another common practice has been to form enlarged terminals with through holes in a predetermined pattern at the end of the conductor. The cover coat, if present, is removed either in small areas around such terminals or over the entire area of the terminal. In either case, the terminals are then placed over corresponding pins in printed wiring pad and then soldered. This is an expensive arrangement and frequently there is a problem of delamination of the printed circuit in the vicinity of the terminal.

Another prior arrangement is to provide solderless connections by making the leads of a fairly hard alloy and forming them with protrusions or points. The protrusions are held against the conductive pad by a resilient member so that the protrusions are pressed into the pad. Most electronic components are manufactured with relaively soft leads and in order to use this arrangement, the component must be specially manufactured or modified after manufacture. Additionally, the assembly of such a circuit with the resilient member such as an elastomer is a time consuming and expensive process.

It is a general object of the present invention to provide an improved electrical connection and method of making it.

A more specific object is to provide an improved solder connection, and a method of making the same, between a thin, flat conductive lead and a flat conductive pad.

SUMMARY OF THE INVENTION

Briefly stated, the invention is based in part on the principle that an increase in surface area of the part being soldered greatly increases the strength of the joint and upon the discovery that such an increase may be obtained by "rippling" thin leads, that is, by forming the leads with ripples or undulations so that when the rippled lead is placed upon the pad, a number of spaces between the pad and the lead are formed. The application of molten solder fills the spaces between the pad and the rippled lead thereby providing a large area of contact between the solder and the lead and forming a soldered joint of increased strength and reliability.

BRIEF DESCRIPTION OF THE DRAWING

For a clearer understanding of the invention, reference may be made to the following detailed description and the accompanying drawing in which.

DESCRIPTION OF PREFERRED EMBODIMENT

Figure 1:
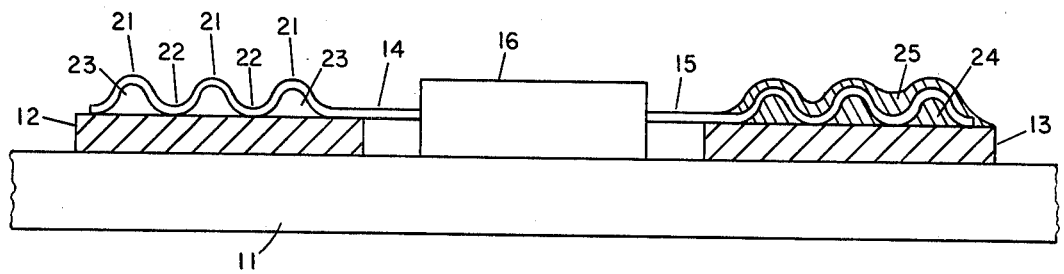
FIG. 1 is a schematic diagram showing the invention as a applied to a soldered joint between the leads of a flat pack integrated circuit and the conductive pads on a printed wiring board.

Referring first to FIG. 1 there is shown a printed wiring board 11 having conductive pads 12 and 13 mounted thereon to which the leads 14 and 15 of a flat pack integrated circuit 16 are to be soldered. As received from the manufacturer, all of the leads (there may be 14 or more) are straight and typically may be about 0.020 inches wide by 0.005 inches thick and perhaps 1 inch long. The lead 14 is typical and, in accordance with the invention, is rippled, that is, it is formed with a plurality of undulating portions including peaks, successive peaks extending in opposite directions. Such undulations may conveniently be formed by a simple die. As shown, the peaks 21 extend in a direction away from the pad 12 and alternate with peaks 22 which extend toward and engage the surface of the pad 12. Alternate peaks 22 engage the surface of the pad at a plurality of spaced apart locations. It is to be understood that the term "engage" as used herein is intended to include close approach to the surface wherein one or more of the leads may be spaced from the surface by a distance which is small compared to the height of the undulations. However, it is preferred at present that each of the peaks actually touch the surface. The successive locations of engagement by the peaks 22 with the surface of the pad 12 are joined by undulatory portions of the lead including the peaks 21 thereby defining a plurality of spaces 23 between the surface of the pad 12 and the undulatory portions of the lead 14. The joint is completed by applying heat and molten solder to each of the pads and leads. As illustrated in connection with the pad 13 and the lead 15, it is preferred that the solder 24 substantially fill each of the spaces 23. During the process additional solder 25 may cling to the upper surface of the lead 15 but this is not essential to the invention. The dimensions of the undulations, or ripples, are not critical but when using leads of the dimensions noted above, a height, or distance between peaks 21 and 22 of about 0.020 inches and a similar distance between adjacent peaks 22 is satisfactory. It has been found that a joint made as described exhibits a much greater resistance to the lifting of the lead from the pad than does a joint made by soldering a flat, unrippled lead to the pad.

Figure 2:
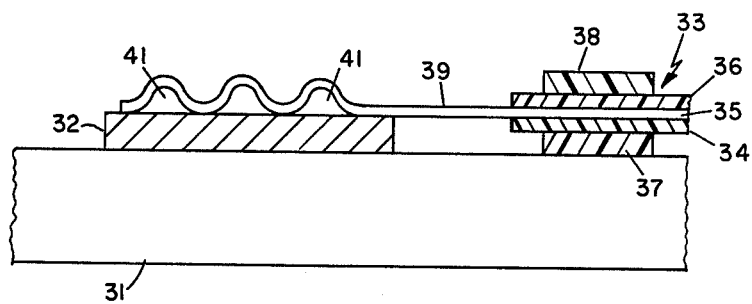
FIG. 2 is a schematic diagram showing the invention as applied to a soldered joint between the conductor of a flexible printed circuit and a pad on a printed wiring board.

Referring now to FIG. 2 there is shown a printed wiring board 31 on which is mounted a conductive pad 32 to which a lead is to be soldered. Also shown is a flexible printed circuit indicated generally by the reference character 33 and comprising an insulating base 34, a thin flat conductor 35 and an insulating cover coat 36. The circuit 33 preferably is fastened to the board 31 by any suitable means such as by being clamped between insulating blocks 37 and 38 which in turn are fastened to the wiring board 31. The base 34 and the cover coat 36 are removed from the very end of the flexible printed circuit leaving a thin flat lead 39. This lead is rippled in the same manner as the leads of FIG. 1, and placed in engagement with the pad 32 in the same manner so as to defne spaces 41 between the pad 32 and the undulatory portions of the lead 39. The joint is completed by applying heat and solder in the same manner as explained in the connection with FIG. 1.

It will be understood that FIGS. 1 and 2 are schematic and not intended to be to scale. These figures illustrate specific applications of the invention. However, the invention can be used equally well whenever it is necessary to join a thin flat conductive lead to a flat surface. For example, a rippled lead in accordance with the invention may be used to advantage to connect the integrated circuit on the ceramic substrate to the lead frame material during the manufacture of integrated circuits.

Although specific embodiments of the invention have been described in considerable detail for illustrative purposes, many modifications will occur to those skilled in the art. It is therefore desired that the protection afforded by Letters Patent be limited only by the true scope of the appended claims.

What is claimed is:

1. The method of soldering a thin, flat conductive lead to a pad having a flat surface comprising the steps of forming said lead with a plurality of undulatory portions, positioning the lead so formed on said surface so that the lead engages the surface at a plurality of spaced apart locations, successive locations being joined by successive undulatory portions extending above the surface thereby defining a plurality of spaces between said surface and said portions, applying molten solder to said lead and said surface so that it substantially fills said spaces, and cooling said lead, said surface and said solder, whereby said surface is joined to said lead throughout the length of said portions.

2. A soldered joint comprising a thin, flat conductive lead formed with a plurality of undulatory portions, a pad having a flat surface, said lead being positioned on said surface so as to engage said surface at a plurality of spaced apart locations, successive locations being joined by successive undulatory portions extending above said surface thereby defining a plurality of spaces between said surface and said portions, and solder engaging said lead and said surface and substantially filling said spaces.

3. A soldered joint in accordance with claim 2 in which said solder surrounds said lead.

4. A soldered joint in accordance with claim 2 including a printed wiring board to which said pad is mounted.

5. A soldered joint in accordance with claim 2 in which said lead is the lead of an integrated circuit.

6. A soldered joint in accordance with claim 2 in which said lead is the conductor portion of a flexible printed circuit.

7. A soldered joint in accordance with claim 6 which includes a printed wiring board to which said pad is fastened.

8. A soldered joint in accordance with claim 7 in which said flexible printed circuit is fastened to said printed wiring board.

* * * * *